United States Patent
Lee et al.

(10) Patent No.: US 8,736,031 B2
(45) Date of Patent: May 27, 2014

(54) SEMICONDUCTOR PACKAGE

(75) Inventors: Jung Aun Lee, Gyunggi-do (KR);
Myeong Woo Han, Gyunggi-do (KR);
Do Jae Yoo, Gyunggi-do (KR); Chul Gyun Park, Gyunggi-do (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 81 days.

(21) Appl. No.: 13/200,406

(22) Filed: Sep. 23, 2011

(65) Prior Publication Data
US 2013/0015563 A1    Jan. 17, 2013

(30) Foreign Application Priority Data
Jul. 12, 2011    (KR) .................. 10-2011-0068930

(51) Int. Cl.
*H01L 23/552* (2006.01)
(52) U.S. Cl.
USPC .......................................... 257/659; 257/728
(58) Field of Classification Search
None
See application file for complete search history.

(56) References Cited

U.S. PATENT DOCUMENTS

| | | | |
|---|---|---|---|
| 7,018,844 B2 | 3/2006 | Yagi et al. | |
| 7,405,664 B2 * | 7/2008 | Sakama et al. | 340/572.7 |
| 8,278,749 B2 * | 10/2012 | Lachner et al. | 257/693 |
| 2006/0001138 A1 * | 1/2006 | Sakama et al. | 257/678 |
| 2008/0291092 A1 * | 11/2008 | Matsunaga | 343/700 MS |
| 2008/0291115 A1 | 11/2008 | Doan et al. | |
| 2009/0184882 A1 | 7/2009 | Jow | |
| 2010/0033393 A1 | 2/2010 | Myszne et al. | |
| 2010/0193935 A1 | 8/2010 | Lachner et al. | |
| 2011/0095385 A1 | 4/2011 | Kawamura | |

FOREIGN PATENT DOCUMENTS

| | | |
|---|---|---|
| CN | 101496298 A | 7/2009 |
| JP | 2010-152449 | 7/2010 |
| JP | 2011-91598 | 5/2011 |
| WO | 2006/133108 A2 | 12/2006 |

OTHER PUBLICATIONS

Korean Office Action issued Jul. 25, 2012 in corresponding Korean Patent Application No. 10-2011-0068930.
Office Action issued by the State Intellectual Property Office of P.R. China on Mar. 3, 2014 in the corresponding Chinese patent application No. 201110349642.9.

* cited by examiner

*Primary Examiner* — David E Graybill (57) ABSTRACT

There is provided a semiconductor package, and more particularly, a semiconductor package including an antenna embedded in an inner portion thereof. The semiconductor package includes: a semiconductor chip; a main antenna disposed to be adjacent to the semiconductor chip and electrically connected thereto; a sealing part sealing both of the semiconductor chip and the main antenna; and an auxiliary antenna formed on an outer surface of the sealing part and coupled to the main antenna.

8 Claims, 6 Drawing Sheets

FIG. 11

SEMICONDUCTOR PACKAGE

CROSS-REFERENCE TO RELATED APPLICATIONS

This application claims the priority of Korean Patent Application No. 10-2011-0068930 filed on Jul. 12, 2011, in the Korean Intellectual Property Office, the disclosure of which is incorporated herein by reference.

BACKGROUND OF THE INVENTION

1. Field of the Invention

The present invention relates to a semiconductor package, and more particularly, to a semiconductor package including an antenna embedded in an inner portion thereof.

2. Description of the Related Art

As a frequency resource for a next generation information communication service, a frequency in the millimeter wave band, a superhigh frequency resource of 30 GHz or more, has been actively studied.

This frequency in the millimeter wave band may be used to transfer a large amount of information at high speed using wideband characteristics, may have less influence through mutual interference on an adjacent geographical area due to significant electrical wave attenuation in the air, and is a frequency band that is not in current use, unlike a frequency band in current use such as 2.5 GHz/5 GHz, or the like, such that it does not have the congestion of a frequency used channel. Therefore, interest in the frequency in the millimeter wave band has increased in view of research and development and business opportunities.

As a result, the development of an information communication service and system using the frequency in the millimeter wave and research into, and development of, various components required for the information communication service and system have been conducted.

In this millimeter wave band, an electrical connection distance between an antenna and a semiconductor chip is very important. That is, when a distance between the antenna and the semiconductor chip is increased, loss is correspondingly increased. Therefore, an antenna in the millimeter wave band (particularly the 60 GHz band) may be electrically connected to the semiconductor chip to be close thereto.

To this end, according to the related art, an antenna is disposed at a position significantly adjacent to a semiconductor package in which a semiconductor chip is embedded, and the antenna and the semiconductor package are electrically connected to each other at the shortest possible distance.

In the case of the related art, a process of separately manufacturing each of the semiconductor package and the antenna and then mounting both thereof on a substrate to thereby be electrically connected need be performed. Therefore, a manufacturing process may be complicated.

In addition, a power feeding structure of an antenna is complicated, such that a manufacturing process thereof may be complicated and it maybe difficult to analyze an influence on a process error.

Therefore, the demand for a semiconductor package structure in which an antenna and a semiconductor package are disposed at a closer distance to each other has increased.

SUMMARY OF THE INVENTION

An aspect of the present invention provides a semiconductor package capable of being easily manufactured while having a significantly reduced electrical distance between an antenna and a semiconductor chip.

Another aspect of the present invention provides a semiconductor package including an antenna embedded in an inner portion thereof.

Another aspect of the present invention provides a semiconductor package capable of significantly increasing radiation efficiency of an antenna even though the antenna is embedded in an inner portion of the semiconductor package.

According to an aspect of the present invention, there is provided a semiconductor package including: a semiconductor chip; a main antenna disposed to be adjacent to the semiconductor chip and electrically connected thereto; a sealing part sealing both of the semiconductor chip and the main antenna; and an auxiliary antenna formed on an outer surface of the sealing part and coupled to the main antenna.

The semiconductor package may further include a substrate having the semiconductor chip and the main antenna disposed on one surface thereof and having external terminals formed on the other surface thereof.

The main antenna and the auxiliary antenna may transceive a high frequency in a millimeter band through the coupling.

The semiconductor chip and the main antenna may be electrically connected to each other by a bonding wire.

The sealing part may include a groove formed in an outer surface thereof at a position corresponding to that of the main antenna, and the auxiliary antenna may be formed in an inner portion of the groove.

The sealing part may include a protrusion part formed on an outer surface thereof at a position corresponding to that of the main antenna, and the auxiliary antenna may be formed on the protrusion part.

A thickness of the sealing part interposed between the main antenna and the auxiliary antenna may be adjusted to thus adjust an antenna radiation pattern and an antenna gain.

The semiconductor package may further include a shielding film formed of a metal plating layer along a circumference of the auxiliary antenna on the outer surface of the sealing part.

The main antenna may be formed as a circuit pattern on one surface of the substrate.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The above and other aspects, features and other advantages of the present invention will be more clearly understood from the following detailed description taken in conjunction with the accompanying drawings, in which.

DETAILED DESCRIPTION OF THE INVENTION

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to most appropriately describe the best method he or she knows for carrying out the invention. Therefore, the configurations described in the embodiments and drawings of the present invention are merely the most preferable embodiments but do not represent all of the technical spirit of the present invention. Thus, the present invention should not be construed as including all the changes, equivalents, and substitutions included in the spirit and scope of the present invention at the time of the filing of this application.

Hereinafter, embodiments of the present invention will be described in detail with reference to the accompanying drawings. At this time, it is noted that like reference numerals denote like elements in appreciating the drawings. Moreover, detailed descriptions related to well-known functions or configurations will be ruled out in order not to unnecessarily obscure the subject matter of the present invention. Based on the same reason, it is to be noted that some components shown in the drawings are exaggerated, omitted or schematically illustrated, and the size of each component does not exactly reflect its actual size.

Hereinafter, embodiments of the present invention will be described in detail with reference to the accompanying drawings.

Figure 1:
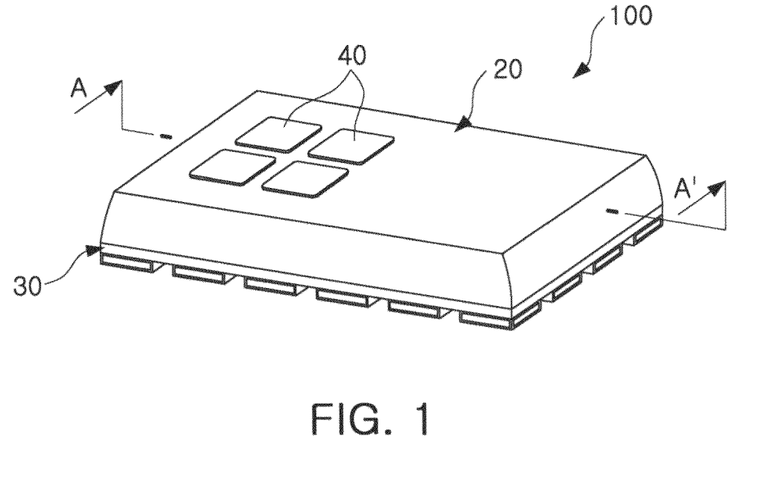
FIG. 1 is a schematic perspective view showing a semiconductor package according to an embodiment of the present invention.

FIG. 1 is a schematic perspective view showing a semiconductor package according to an embodiment of the present invention. In addition, FIG. 2 is a cross-sectional view taken along line A-A' of the semiconductor package shown in FIG. 1; and FIG. 3 is an exploded perspective view of the semiconductor package shown in FIG. 1.

Figure 2:
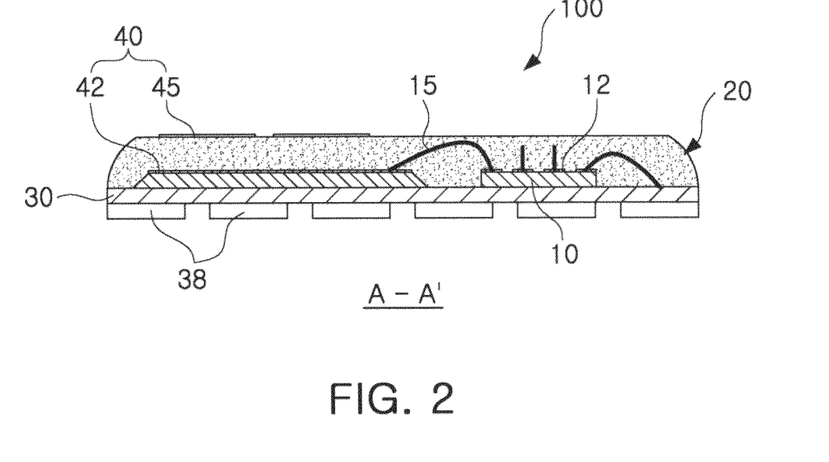
FIG. 2 is a cross-sectional view taken along line A-A' of the semiconductor package shown in FIG. 1.
Figure 3:
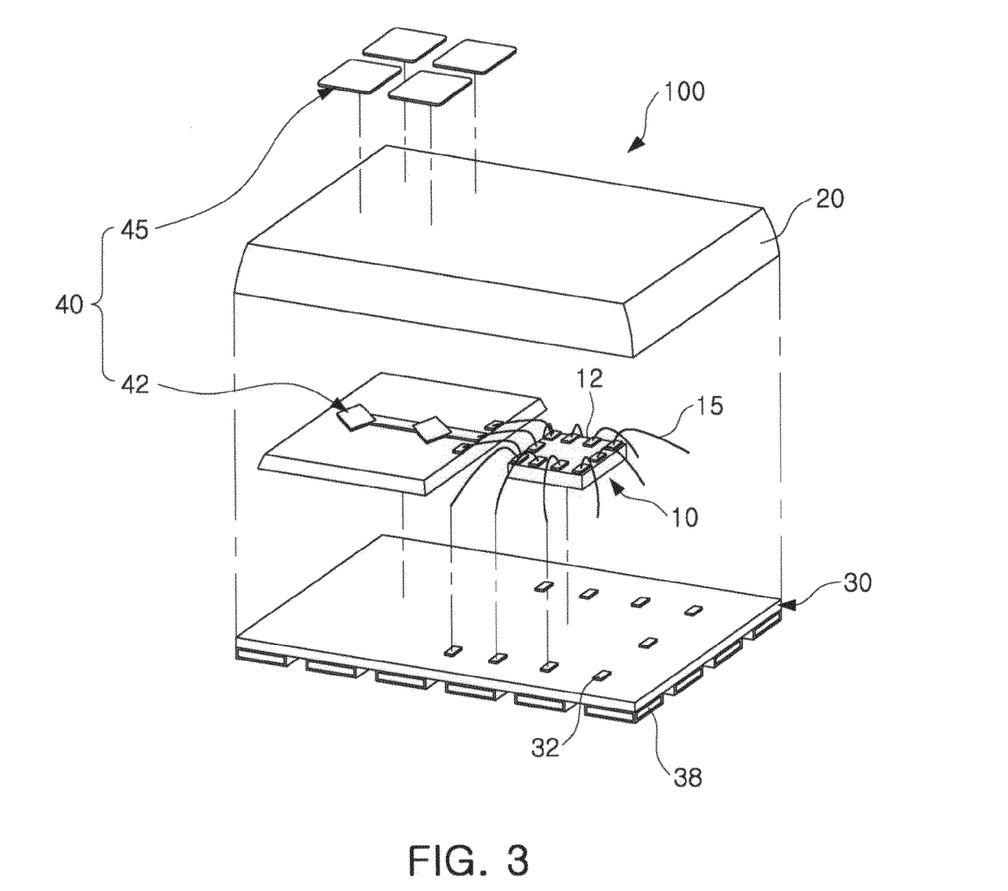
FIG. 3 is an exploded perspective view of the semiconductor package shown in FIG. 1.

As shown in FIGS. 1 through 3, a semiconductor package 100 according to an embodiment of the present invention may include a substrate 30, a semiconductor chip 10, a sealing part 20 sealing the semiconductor chip 10, and an antenna part 40.

The semiconductor chip 10 may include a plurality of connection pads 12 for connection to the outside and may be electrically connected to a substrate 30 and an antenna part 40 to be described below through the connection pads 12. The semiconductor chip 10 according to the present embodiment is electrically connected to the substrate 30 and the antenna part 40 through a bonding wire 15. However, the present invention is not limited thereto. The semiconductor chip 10 may be connected to the substrate 30 and the antenna part 40 in various manners according to a shape thereof or as needed.

For example, the semiconductor chip 10 may also be electrically connected to the antenna part 40 through the bonding wire 15 and connected to the substrate 30 through a lower surface thereof. In this case, the semiconductor chip 10 may include electrode bumps, solder balls, or the like, formed on the lower surface thereof, wherein the electrode bumps or the solder balls are electrically or physically connected to the substrate 30.

This semiconductor chip 10 may perform wireless communication with the outside through an antenna part 40 to be described below.

The substrate 30 includes the semiconductor chip 10 fixedly seated on one surface thereof and is electrically connected to the semiconductor chip 10. As the substrate 30, various kinds of substrates well known in the art (for example, a silicon substrate, a ceramic substrate, a printed circuit board (PCB), a flexible substrate, and the like) may be used.

The substrate 30 includes electrode patterns 32 formed on one surface thereof, wherein the electrode patterns are electrically connected to the semiconductor chip 10. In addition, circuit patterns (not shown) electrically connecting the electrode patterns 32 to each other may also be formed.

The substrate 30 according to the present embodiment may be a multi-layer substrate configured of a plurality of layers. Therefore, circuit patterns (not shown) for forming an electrical connection and conductive vias (not shown) for electrically connecting respective layers may be formed between each layer.

In addition, the substrate 30 may include external electrodes 38 formed on the other surface thereof, that is, an outer surface thereof, wherein the external electrodes 38 electrically connect the semiconductor package 100 to the outside. The external electrodes 38 may be electrically connected to the electrode pattern 32 through the circuit patterns or the conductive vias formed in the inner portion of the substrate 30.

The sealing part 20 may provided in a form in which it encloses both the semiconductor chip 10 and a main antenna 42 to be described below therein to thereby seal the semiconductor chip 10 and the main antenna 42. That is, the sealing part 20 encloses outer portions of the semiconductor chip 10 and the main antenna 42 and fixes the semiconductor chip 10 and the main antenna 42 to the substrate 30, thereby securely protecting the semiconductor chip 10 and the main antenna 42 from external impact.

As a method for forming the sealing part 20, a molding method may be used. In this case, an epoxy mold compound (EMC) may be used as a material of the sealing part 20. However, the present invention is not limited thereto. That is, various methods such as a printing method, a spin coating method, a jetting method, and the like, may be used for forming the sealing part 20 as needed.

The antenna part 40 may include the main antenna 42 and an auxiliary antenna 45.

The main antenna 42 is disposed on one surface of the substrate 30 and is buried together with the semiconductor chip 10 in the sealing part 20.

The main antenna 42 may be manufactured as a separate antenna module and subsequently mounted on the substrate 30. However, the main antenna is not limited to the above-mentioned configuration but may also be directly formed as a circuit pattern on one surface of the substrate 30.

This main antenna 42 may be disposed to be significantly adjacent to the semiconductor chip 10 and electrically connected to the semiconductor chip 10 through the bonding wire 15. Therefore, the main antenna 42 according to the present embodiment has a significantly short electrical connection distance with the semiconductor chip 10, whereby radiation loss generated due to the connection distance may be significantly reduced.

In addition, the main antenna 42 may have improved characteristics such as a radiation direction, gain, or the like, through changing a position of a power feed connected to the semiconductor chip 10 or the number, sizes, and shapes of radiators. In this case, a distance between the radiators and positions of the power feeds, sizes and shapes of the respective radiators may be used as a design variable of the semiconductor package 100.

The auxiliary antenna 45 may be formed on an outer surface of the sealing part 20. Particularly, the auxiliary antenna 45 may be disposed at a position adjacent to the main antenna 42. The present embodiment describes a case in which the auxiliary antenna 45 is formed in a position in which a vertical distance between the auxiliary antenna 45 and the main antenna 42 is relatively minimized by way of example. However, the present invention is not limited to the above-mentioned configuration.

Meanwhile, the auxiliary antenna 45 is not electrically connected to the semiconductor chip 10 or the main antenna 42 and is paired with the main antenna 42 to thereby operate as a coupled antenna. The auxiliary antenna 45 may serve to amplify a strength of an electromagnetic field generated by the main antenna 42 through being coupled thereto.

The main antenna 42 and the auxiliary antenna 45 according to the present embodiment configured as described above may have various shapes as needed. The shapes of the main antenna 42 and the auxiliary antenna 45 may be varied, such as a liner, polygonal, circular, or like shape, and may be formed in a dipole form or a monopole form.

In addition, the main antenna 42 and the auxiliary antenna 45 may have the same or different shapes as shown in FIG. 2.

Further, in the auxiliary antenna 45, the number, positions, sizes of radiators, intervals therebetween, and the like, may be used as a design variable of the semiconductor package.

Meanwhile, although the present embodiment describes a case in which the auxiliary antenna 45 is formed only on an upper surface, that is, on the sealing part 20, by way of example, the present invention is not limited thereto. That is, various applications may be provided as needed. For example, the auxiliary antenna may additionally be formed on a lower surface of the substrate 30 in order to increase radiation characteristics of the antenna part 40.

In the semiconductor package 100 according to the present embodiment, configured as described above, the main antenna 42 is mounted together with the semiconductor chip 10 on the substrate 30 and then sealed, such that an electrical distance between the main antenna 42 and the semiconductor chip 10 is relatively, significantly reduced. Therefore, when the semiconductor package 100 according to the present embodiment is used in the millimeter wave band (particularly, 60 GHz band), loss generated between the antenna part 40 and the semiconductor chip 10 may be significantly reduced.

In addition, the main antenna 42 may be buried in the inner portion of the sealing part 20, whereby the main antenna 42 may be easily protected from an external environment.

Meanwhile, the main antenna 42 is buried in the inner portion of the sealing part 20, such that characteristics of the main antenna 42 may be deteriorated by the sealing part 20. Thus, the semiconductor package 100 according to the present embodiment may further include the auxiliary antenna 45.

The auxiliary antenna 45 may operate as an antenna coupled with the main antenna 42, whereby the characteristics of the antenna lost by the sealing part 20 may be complemented. Measurement data thereof is shown in FIGS. 5A and 5B.

Figure 4A:
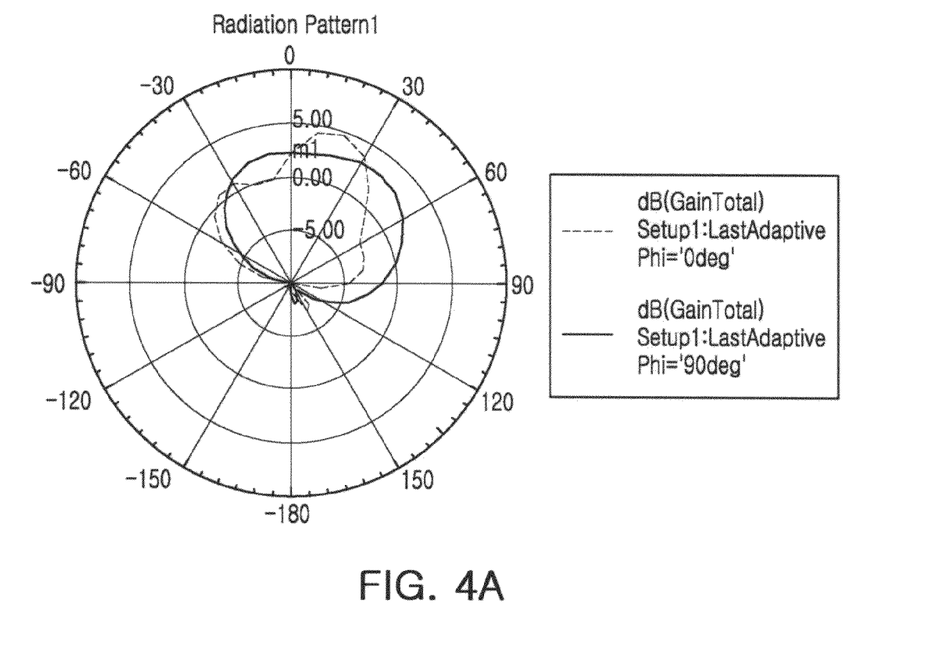
FIGS. 4A and 4B are graphs showing radiation characteristics of a semiconductor package in a state in which the semiconductor package does not include an auxiliary antenna.
Figure 4B:
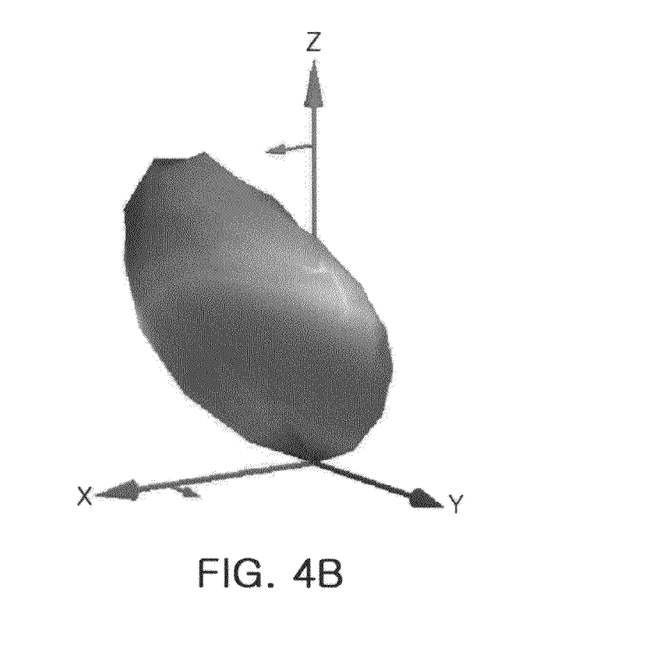
Figure 5A:
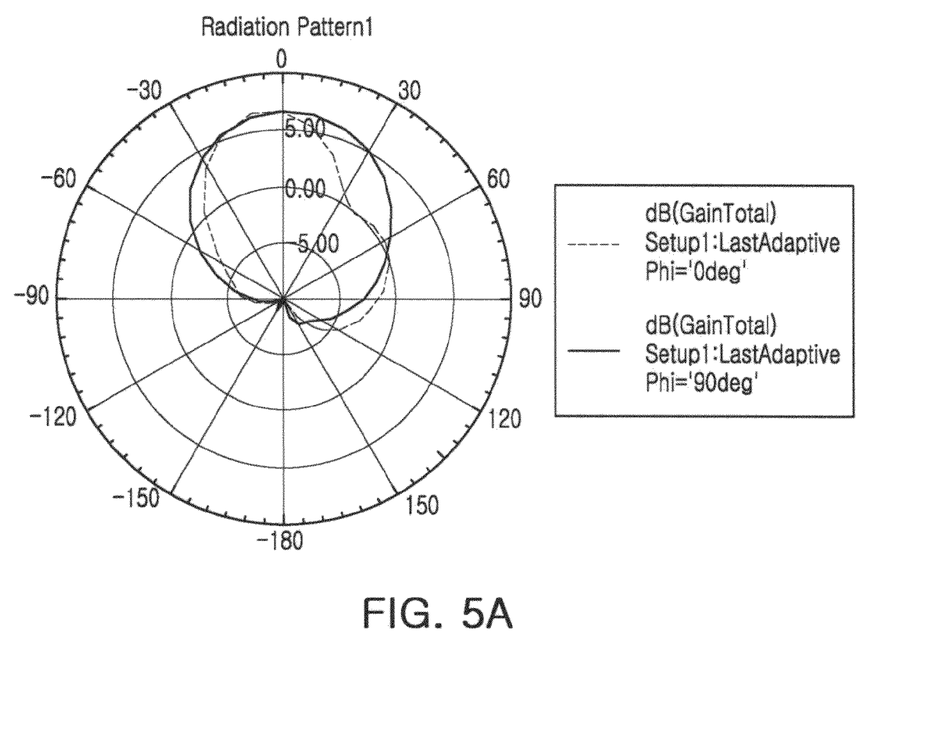
FIGS. 5A and 5B are graphs showing radiation characteristics of a semiconductor package in a state in which the semiconductor package includes an auxiliary antenna.
Figure 5B:
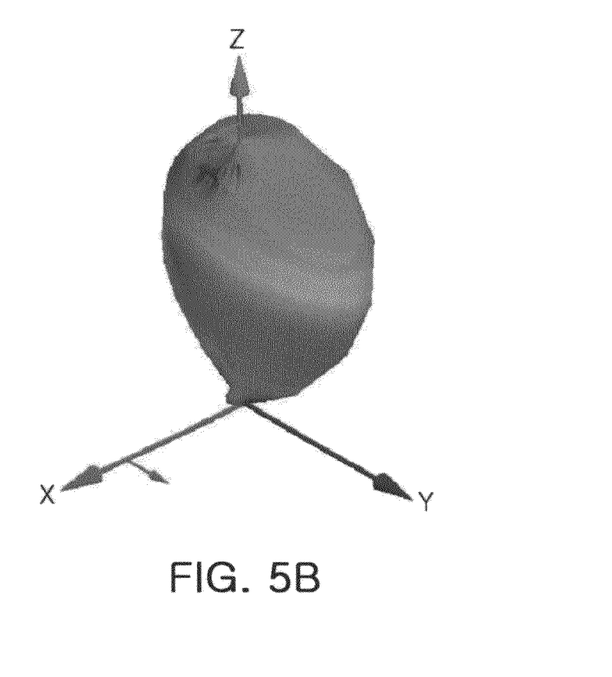

FIGS. 4A and 4B are graphs showing radiation characteristics of a semiconductor package in a state in which the semiconductor package does not include an auxiliary antenna; and FIGS. 5A and 5B are graphs showing radiation characteristics of a semiconductor package in a state in which the semiconductor package includes an auxiliary antenna.

Here, FIGS. 4A and 5A are graphs showing a gain of an antenna part; and FIGS. 4B and 5B are graphs showing a radiation direction of the antenna part.

The semiconductor package 100 according to the present embodiment may be designed so that radiation is performed vertically upwardly from an antenna surface. Therefore, a radiation direction may be formed along a Z axis.

When the semiconductor package does not include the auxiliary antenna 45, an antenna gain is relatively small, as shown in FIG. 4A. In addition, a radiation direction is shown in a form in which it is inclined toward an X axis direction at a predetermined angle as shown in FIG. 4B.

On the other hand, when the semiconductor package includes the auxiliary antenna 45, as shown in FIGS. 5A and 5B, it may be appreciated that an antenna gain and a radiation direction are significantly improved as compared to FIGS. 4A and 4B.

The graphs shown in FIGS. 5A and 5B are significantly similar to graphs of an antenna gain and a radiation direction measured in a state in which the sealing part 20 is omitted.

That is, in the case of the semiconductor package 100 according to the present embodiment, even though the main antenna 42 is buried in the sealing part 20, the antenna characteristics of the main antenna 42 maybe complemented by the auxiliary antenna 45, whereby radiation characteristics at a level of the semiconductor package 100 that does not include the sealing part 20 may be obtained.

Therefore, the semiconductor package 100 according to the present embodiment may implement significantly good antenna characteristics while protecting the main antenna 42 and the semiconductor chip 10 from the outside through the sealing part 20.

In the semiconductor package 100 according to the present embodiment, relativley prominent effects in the millimeter wave (mm wave) band, more specifically, in the 60 GHz band, in which characteristics are largely deteriorated corresponding to a distance between the semiconductor chip and the antenna, may be obtained.

Meanwhile, the semiconductor package 100 according to the present embodiment is not limited to the above-mentioned embodiment but may be variously applied. Semiconductor package 100 modules according to embodiments to be described below may have a similar structure to the semiconductor package 100 (See FIG. 2) according to the above-mentioned embodiment and may be merely different therefrom in a position or a form in which an auxiliary antenna 45 is formed. Therefore, a detailed description of the same components will be omitted, and the position or the form in which the auxiliary antenna 45 is formed will be mainly described in more detail. In addition, the same reference numerals will be used to describe the same components as those of the above-mentioned embodiment.

FIGS. 6 through 11 are perspective views schematically showing a semiconductor package according to other embodiments of the present invention.

Figure 6:
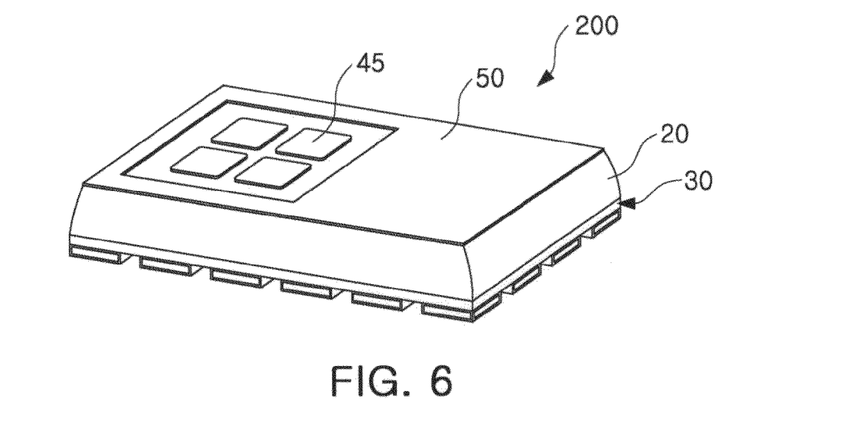
FIGS. 6 through 11 are perspective views schematically showing a semiconductor package according to other embodiments of the present invention.

First, a semiconductor package 200 according to the present embodiment shown in FIG. 6 may have a similar configuration to that of the semiconductor package 100 (See FIG. 2) according to the above-mentioned embodiment and may be different therefrom in that a shielding film 50 as well as an auxiliary antenna 45 are formed on an outer surface, that is, an upper surface, of a sealing part 20.

The auxiliary antenna 45 may have the same configuration as that of the auxiliary antenna 45 according to the above-mentioned embodiment.

In addition, the shielding film 50, which is a metal plating layer, may be disposed in the vicinity of the auxiliary antenna 45 so that the auxiliary antenna 45 is disposed in an inner portion thereof. In the case of the present embodiment, the shielding film 50 may be formed in a form in which it covers the entire upper surface of the sealing part 20 except for a portion at which the auxiliary antenna 45 is formed.

The shielding film 50 may be provided in order to shield interference generated between the auxiliary antenna 45 and the bonding wire 15 (See FIG. 2) of the semiconductor chip 10. Therefore, the shielding film 50 is not limited to have a shape shown in FIG. 6 but may have various shapes or forms according to a form in which the bonding wire is disposed, or the like.

In addition, similar to the auxiliary antenna 45, the shielding film 50 may be configured so as not to be electrically connected to the semiconductor chip 10 or the main antenna 42. However, the shielding film may also be configured so as to be connected to a ground of the semiconductor package 100 as needed.

Figure 7:
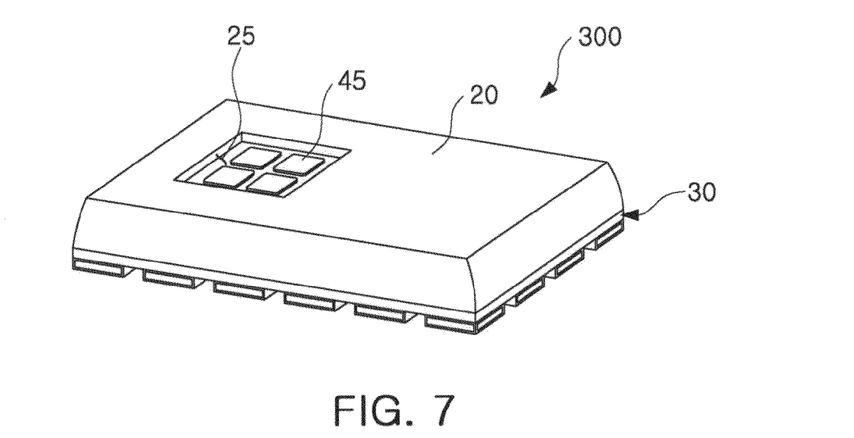

A semiconductor package 300 shown in FIG. 7 may be different from the semiconductor package 100 shown in FIG. 2 in that a groove 25 is formed in an outer surface, that is, an upper surface, of a sealing part 20, and an auxiliary antenna 45 is formed in an inner portion of the groove 25.

The groove 25 may be formed by removing a portion of the sealing part 20 after the formation of the sealing part 20 or formed together with the sealing part 20 at the time of the formation of the sealing part 20 using a mold.

The groove 25 may be set to have a depth at which relatively best antenna characteristics of the antenna part 40 are shown. Therefore, the groove may have an appropriate depth according to each of a size or a thickness of the semiconductor package 100, a shape or a characteristic of the main antenna 42, a material or a permittivity of the sealing part 20, or the like.

When the groove 25 is formed and the auxiliary antenna 45 is disposed in the inner portion of the groove 25 as described above, a relative permittivity between an upper end of the auxiliary antenna 45 and the surroundings may be adjusted. Therefore, an antenna radiation pattern or gain may be improved by setting a depth of the groove 24.

Figure 8:
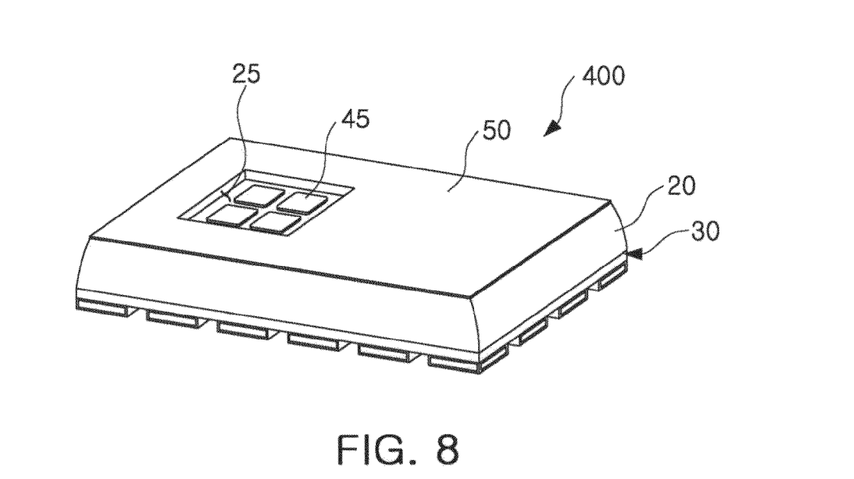
Figure 9:
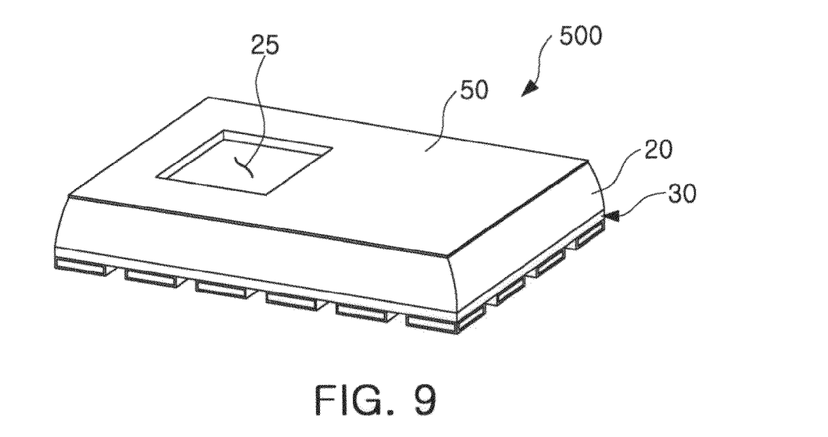

A semiconductor package 400 shown in FIG. 8 shows a case in which a groove 25 is formed in an outer surface, that is, an upper surface, of a sealing part 20, an auxiliary antenna 45 is formed in an inner portion of the groove 25, and a shielding film 50 is formed on an outer surface of the groove 25 by way of example. In addition, a semiconductor package 500 shown in FIG. 9 shows a case in which only a shielding film 50 is formed on an outer portion of the groove 25 in the semiconductor package 400 of FIG. 8 by way of example.

Figure 10:
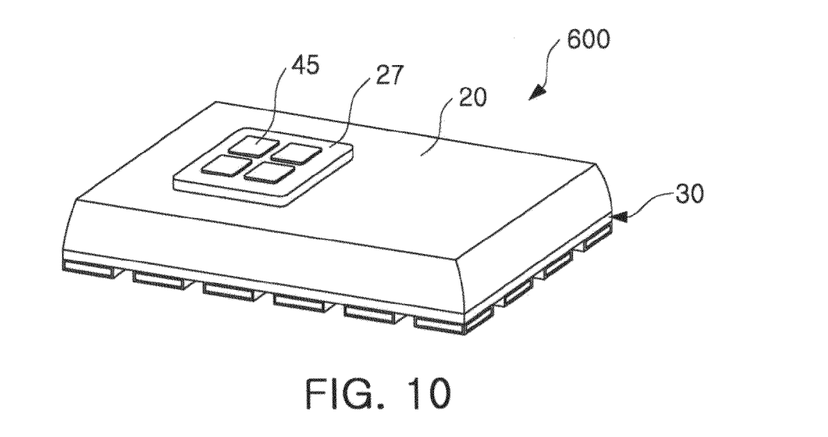
Figure 11:
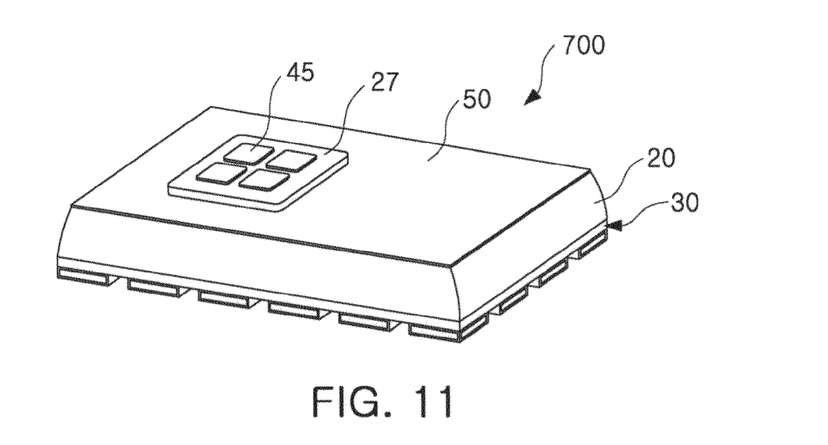

Further, a semiconductor package 600 shown in FIG. 10 shows a case in which an outwardly protruding protrusion part 27 is formed on an outer surface, that is, an upper surface, of a sealing part 20, and an auxiliary antenna 45 is formed on an upper surface of the protrusion part 27 by way of example. Furthermore, a semiconductor package 700 shown in FIG. 11 shows a case in which a shielding film 50 is formed on an outer portion of the protrusion part 27 in the semiconductor package 600 of FIG. 10 by way of example.

As described above, the semiconductor package according to an embodiment of the present invention may be configured to have various forms according to a position or a form in which the auxiliary antenna is formed.

Particularly, in the case of the semiconductor package according to the present invention, in order to improve the antenna characteristics thereof, the shape of the auxiliary antenna, the number of radiators thereof, or the like, may be adjusted as described above. In addition, the groove or the protrusion part is formed in or on the sealing part to adjust a thickness of the sealing part interposed between the main antenna and the auxiliary antenna, whereby a relative permittivity between the auxiliary antenna and the main antenna maybe adjusted. Therefore, the antenna radiation pattern and the antenna gain may be easily adjusted at the time of manufacturing of the semiconductor package.

The semiconductor package module according to the embodiments of the present invention is not limited to the above-mentioned embodiments but may be variously applied.

In addition, although the above-mentioned embodiments describe the semiconductor package mounted on the substrate by way of example, the present invention is not limited thereto but may be variously applied to any semiconductor package in which packaging is performed by a sealing part such as a lead frame, or the like.

As set forth above, the semiconductor package according to the embodiment of the present invention uses a scheme of sealing the semiconductor chip and the main antenna together with each other to protect the semiconductor chip and the main antenna from the outside, whereby the semiconductor chip and the main antenna may be easily protected from an external environment. In addition, semiconductor chips having various forms such as a chip, a chip using a wire bonding scheme, or the like, may be utilized.

Further, the main antenna and the semiconductor chip are disposed adjacent to each other to be sealed together, whereby an electrical connection distance between the semiconductor chip and the main antenna may be significanity reduced. Therefore, when the semiconductor package is used in the millimeter wave band (particularly the 60 GHz band), loss generated between the main antenna and the semiconductor chip may be significantly reduced.

Furthermore, in the semiconductor package according to the embodiment of the present invention, even though the main antenna is buried in the sealing part, the antenna characteristics of the main antenna are complemented by the auxiliary antenna, whereby radiation characteristics at a level of the semiconductor package that does not include the sealing part may be obtained.

Therefore, the semiconductor package according to the embodiment of the present invention may have significantly good antenna characteristics while protecting the main antenna and the semiconductor chip from the outside through the sealing part.

In addition, a thickness and a material characteristic (permittivity) of the sealing part interposed between the main antenna and the auxiliary antenna are adjusted, whereby the antenna characteristics may be adjusted. Therefore, signal matching of the antenna may be performed during a manufacturing process.

While the present invention has been shown and described in connection with the embodiments, it will be apparent to those skilled in the art that modifications and variations can be made without departing from the spirit and scope of the invention as defined by the appended claims.

What is claimed is:

1. A semiconductor package comprising:
   a semiconductor chip;
   a main antenna disposed to be adjacent to the semiconductor chip and electrically connected thereto;
   a sealing part sealing both of the semiconductor chip and the main antenna; and
   an auxiliary antenna formed on an outer surface of the sealing part and coupled to the main antenna,
   wherein the sealing part includes a groove formed in an outer surface of the sealing part at a position corresponding to the position of the main antenna, and the auxiliary antenna is formed in an inner portion of the groove.

2. The semiconductor package of claim 1, further comprising a substrate having the semiconductor chip and the main antenna disposed on one surface of the substrate and having external terminals formed on the other surface of the substrate.

3. The semiconductor package of claim 1, wherein the main antenna and the auxiliary antenna transmit and receive a high frequency in a millimeter band through the coupling.

4. The semiconductor package of claim 1, wherein the semiconductor chip and the main antenna are electrically connected to each other by a bonding wire.

5. The semiconductor package of claim 1, wherein the sealing part includes a protrusion part formed on an outer surface thereof at a position corresponding to that of the main antenna, and the auxiliary antenna is formed on the protrusion part.

6. The semiconductor package of claim 1, wherein a thickness of the sealing part interposed between the main antenna and the auxiliary antenna is adjusted to thus adjust an antenna radiation pattern and an antenna gain.

7. The semiconductor package of claim 1, further comprising a shielding film formed of a metal plating layer along a circumference of the auxiliary antenna on the outer surface of the sealing part.

8. The semiconductor package of claim 2, wherein the main antenna is formed as a circuit pattern on one surface of the substrate.

* * * * *